United States Patent
Cheng et al.

(10) Patent No.: US 10,332,983 B1
(45) Date of Patent: Jun. 25, 2019

(54) VERTICAL FIELD-EFFECT TRANSISTORS INCLUDING UNIFORM GATE LENGTHS

(71) Applicant: International Business Machines Corporation, Armonk, NY (US)

(72) Inventors: Kangguo Cheng, Schenectady, NY (US); Choonghyun Lee, Rensselaer, NY (US); Juntao Li, Cohoes, NY (US); Heng Wu, Guilderland, NY (US); Peng Xu, Santa Clarra, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/935,468

(22) Filed: Mar. 26, 2018

(51) Int. Cl.
*H01L 29/66* (2006.01)
*H01L 29/06* (2006.01)
*H01L 29/78* (2006.01)
*H01L 21/225* (2006.01)
*H01L 21/02* (2006.01)
*H01L 29/423* (2006.01)

(52) U.S. Cl.
CPC .. *H01L 29/66666* (2013.01); *H01L 21/02236* (2013.01); *H01L 21/02255* (2013.01); *H01L 21/2255* (2013.01); *H01L 29/0653* (2013.01); *H01L 29/42376* (2013.01); *H01L 29/66553* (2013.01); *H01L 29/7827* (2013.01)

(58) Field of Classification Search
CPC .................................................. H01L 29/66666
USPC ........................................................ 257/329
See application file for complete search history.

(56) References Cited

U.S. PATENT DOCUMENTS

| 9,246,015 | B2 | 1/2016 | Hsu et al. |
| 9,728,635 | B1* | 8/2017 | Cheng ................. H01L 29/7827 |
| 9,741,716 | B1* | 8/2017 | Cheng ................. H01L 27/0886 |
| 9,780,197 | B1 | 10/2017 | Xie et al. |
| 9,806,153 | B1* | 10/2017 | Cheng ................. H01L 29/1033 |
| 2010/0148224 | A1 | 6/2010 | Zhao |
| 2016/0049483 | A1 | 2/2016 | Zhang et al. |
| 2017/0317211 | A1 | 11/2017 | Kim |
| 2018/0033788 | A1 | 2/2018 | Cheng et al. |
| 2018/0033869 | A1 | 2/2018 | Cheng et al. |

* cited by examiner

*Primary Examiner* — Jami Valentine Miller
(74) *Attorney, Agent, or Firm* — Vazken Alexanian; Otterstedt, Ellenbogen & Kammer, LLP

(57) ABSTRACT

Vertical field-effect transistors are fabricated while controlling gate length by causing enhanced oxidation of silicon germanium regions on parallel semiconductor fin channel regions. Oxidation of the silicon germanium region is accompanied by volume expansion and condensation. Shared or non-shared gate structures are formed on the sidewalls of the semiconductor fin channel regions. A dielectric liner may be incorporated with self-aligned oxide regions to form a composite spacer for providing electrical isolation of the top source/drain regions.

20 Claims, 12 Drawing Sheets

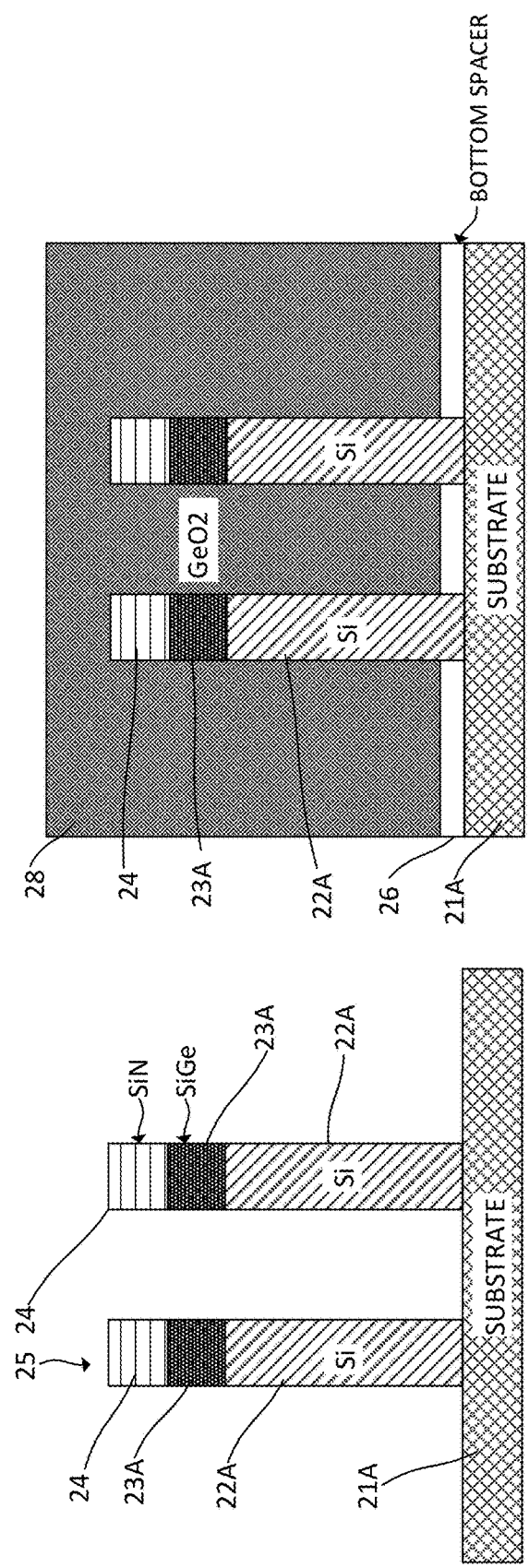

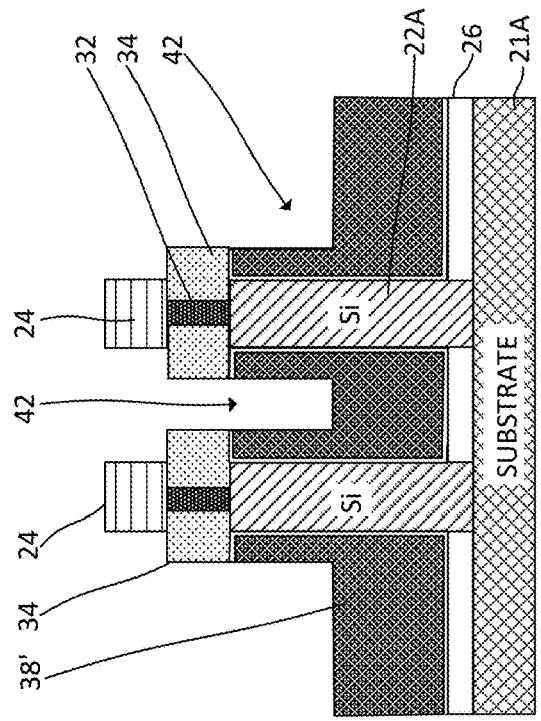
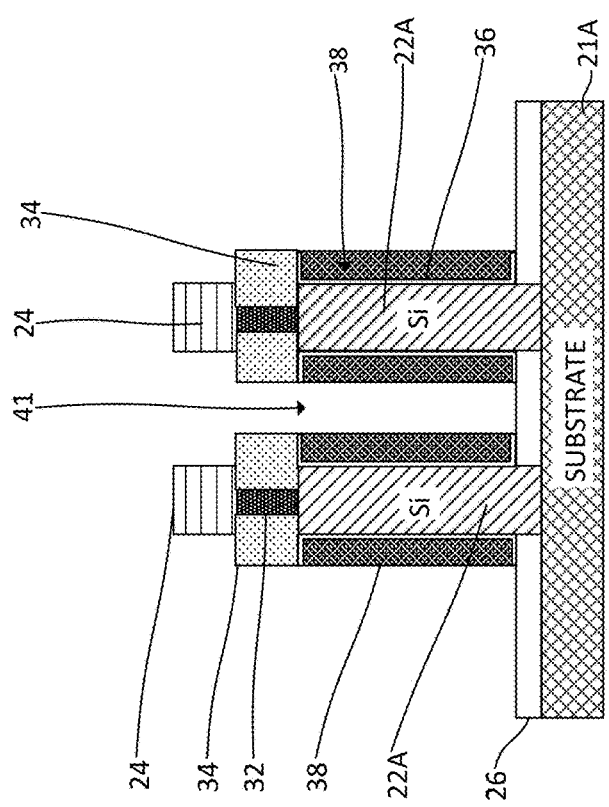
FIG. 6A
FIG. 6B

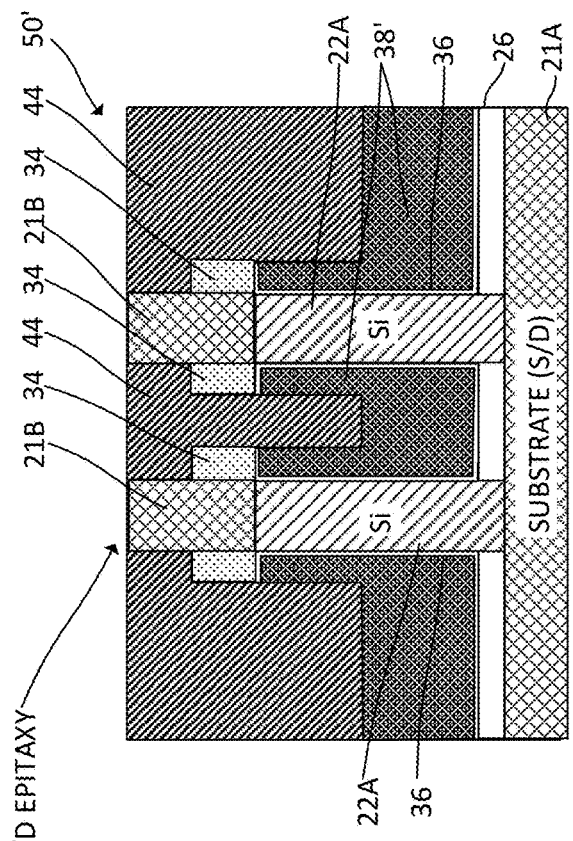
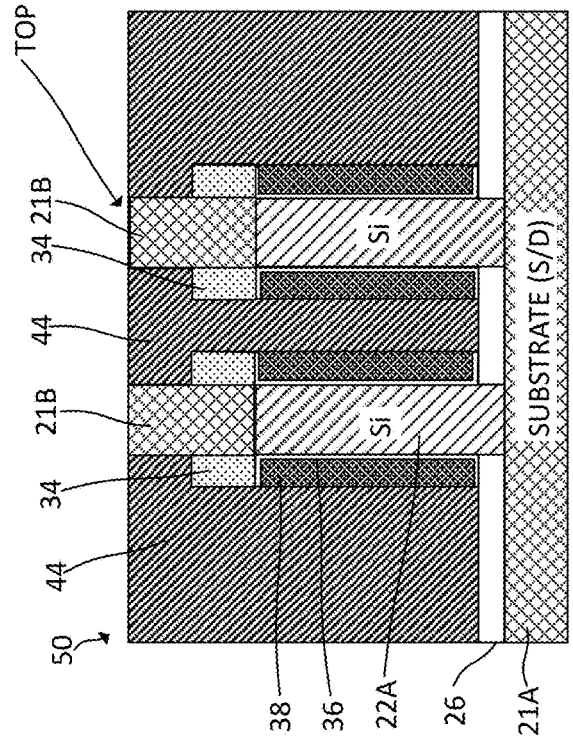

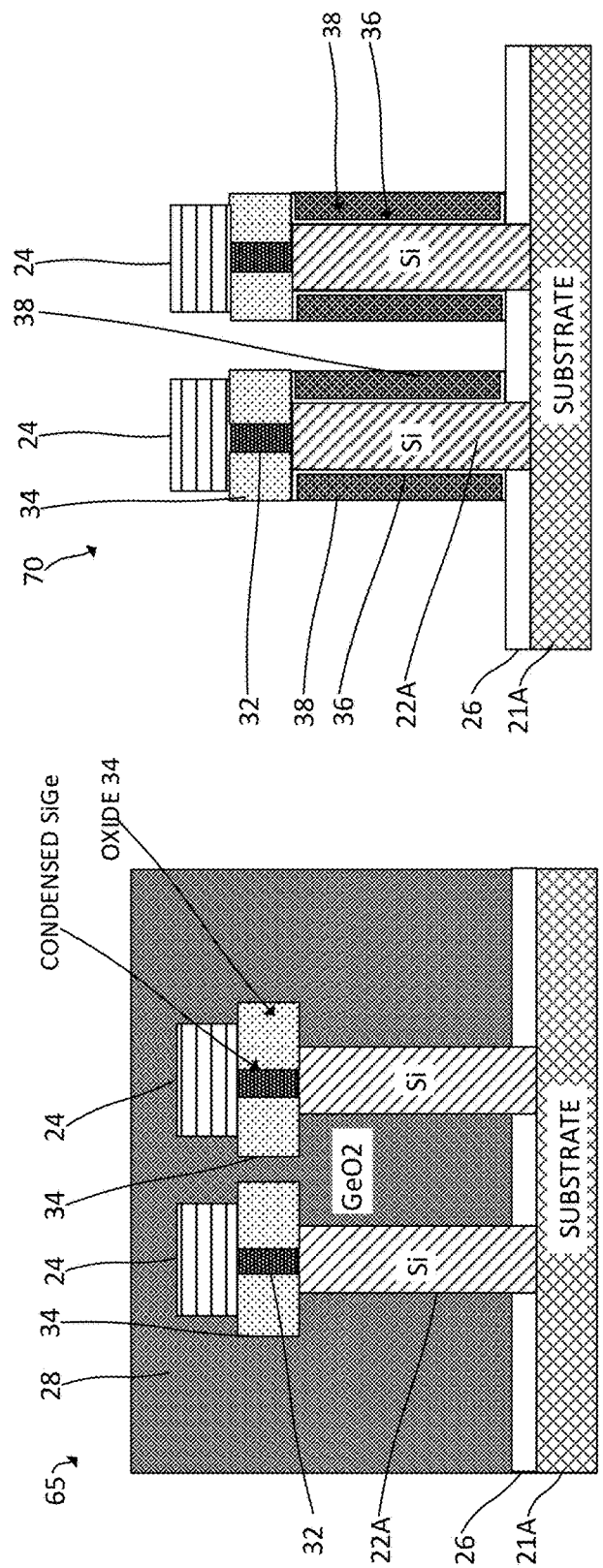

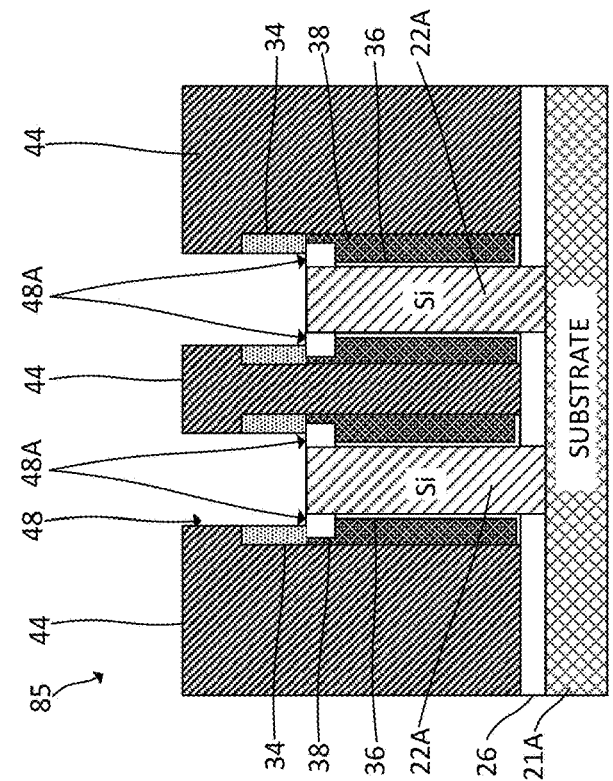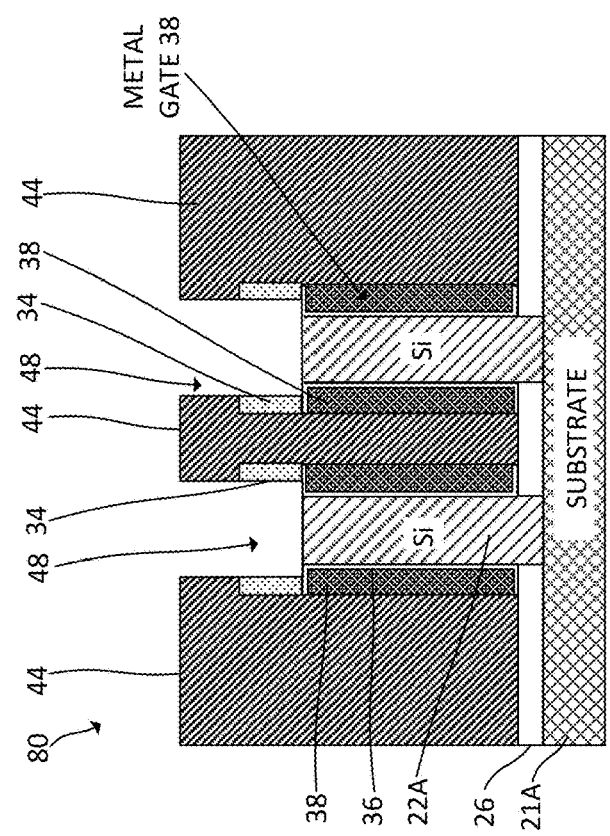

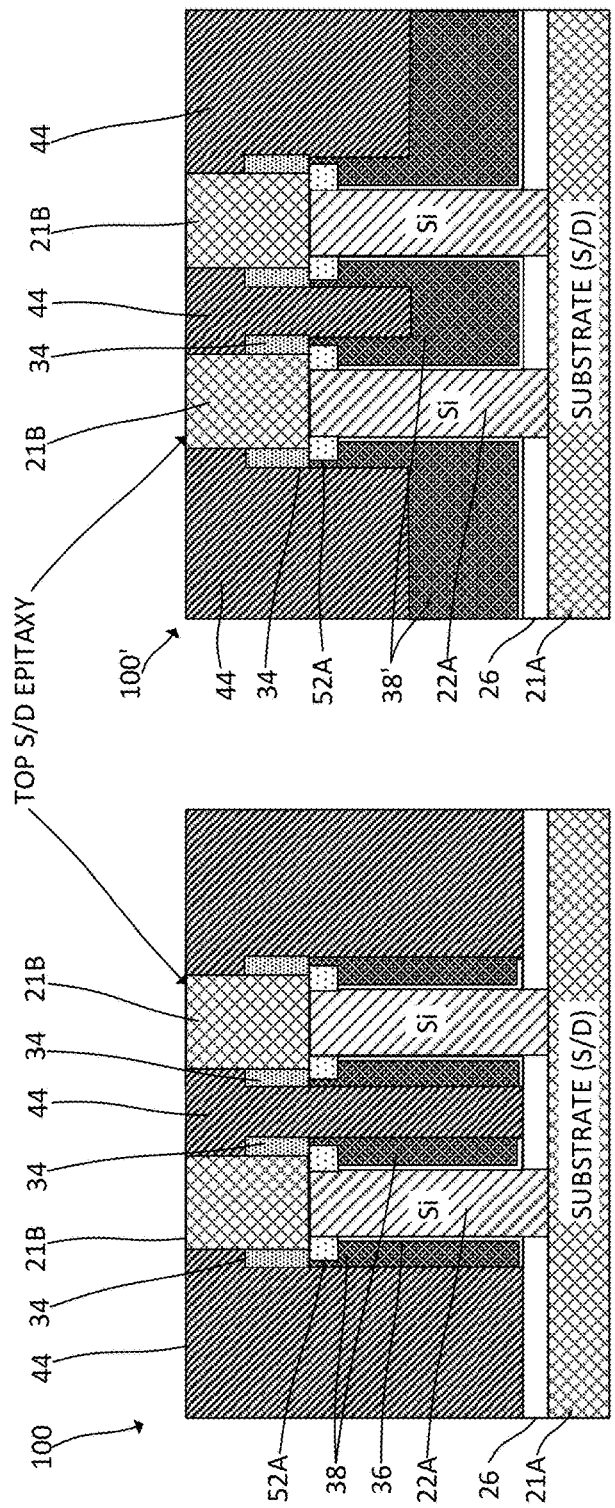

VERTICAL FIELD-EFFECT TRANSISTORS INCLUDING UNIFORM GATE LENGTHS

BACKGROUND

The present invention relates generally to the electrical, electronic and computer arts and, more particularly, to vertical transistor structures.

Metal oxide semiconductor field-effect transistors (MOSFETs) include gate electrodes that are electrically insulated from operatively associated semiconductor channels by thin layers of dielectric material. MOSFETs having n-doped source and drain regions employ electrons as the primary current carriers while those having p-doped source and drain regions use holes as primary current carriers. Vertical field-effect transistors (VFETs) have configurations wherein the current between the drain and source regions is substantially normal to the surface of the die. A vertical field-effect transistor may, for example, include a semiconductor pillar or fin having top and bottom regions comprising source/drain regions, the portion of the pillar between the source/drain regions defining a channel region. Vertical field-effect transistors (VFETs) are characterized by doped, possibly vertical channel regions, p-n junctions on one or more sides of the channels, and ohmic contacts forming the source and drain regions.

Vertical FETs (VFETs) are a promising alternative to standard lateral FET structures due to potential benefits, among others, in terms of reduced circuit footprint. VFETs can potentially provide electronic devices comprising logic circuits with improved circuit density. Such logic circuits can be characterized by a lower-number CPP (cell gate pitch) versus comparable logic circuits comprising lateral FET layouts. Minimum wiring pitch can also be relevant for realizing denser vertical FET layouts.

Sidewall image transfer (SIT) is a widely used technique for tight semiconductor fin patterning, for example arrays of silicon fins with a pitch of 18-28 nm. Optical lithography (OPL) patterning can result in "fin pitch walking." Pitch walking refers to the presence of different periodicities in an array due to the lithographic process employed in forming the array. Fin pitch walking and iso-dense bias may lead to variable metal gate recess depth which may in turn lead to variable gate length and variable device performance.

BRIEF SUMMARY

Monolithic semiconductor structures including vertical FETs and fabrication of such structures are aspects of inventions disclosed herein.

In one aspect, an exemplary method of fabricating a monolithic structure including a plurality of vertical field-effect transistors is provided. The method includes obtaining a first structure including a bottom source/drain layer and a plurality of fin structures. Each of the fin structures includes a semiconductor fin base portion comprising silicon and adjoining and extending vertically from the doped source/drain layer. Each semiconductor fin base portion further includes a top surface and vertically extending sidewalls. Each fin structure further includes a dielectric cap and a silicon germanium portion between the semiconductor fin base portion and the dielectric cap. The fin structures are parallel to each other. A bottom dielectric spacer is deposited on the bottom source/drain layer. A germanium-containing oxide layer is deposited over the first structure and directly contacts the semiconductor fin base portions and the silicon germanium portions of the fin structures. The method further includes thermally annealing the first structure subsequent to depositing the oxide layer, thereby causing formation of condensed silicon germanium regions and oxide structures from the silicon germanium portions of the fin structures, the oxide structures extending laterally from the condensed silicon germanium regions and including inner oxide regions adjoining the condensed silicon germanium regions and outer oxide regions extending laterally from the inner oxide regions. The condensed silicon germanium regions have higher germanium concentrations than the silicon germanium portions of the original fin structures. The semiconductor fin base portions of the fin structures remaining essentially unoxidized during the thermal annealing of the first structure. The oxide layer is removed following thermally annealing the first structure. A gate dielectric layer is deposited on the semiconductor fin base portions of the fin structures and a gate electrode layer is deposited over the gate dielectric layer and the bottom dielectric spacer. A dielectric material layer is deposited over the bottom dielectric spacer and the gate electrode layer. The dielectric caps, the condensed silicon germanium regions and the inner oxide regions are removed, thereby exposing at least the top surfaces of the semiconductor fin base portions. Top source/drain regions are epitaxially formed on the semiconductor fin base portions.

In a further aspect, a monolithic structure is provided that includes a plurality of vertical field-effect transistor structures. The monolithic structure includes a bottom source/drain layer and a plurality of parallel semiconductor fin channel regions operatively associated with the bottom source/drain layer. Each of the semiconductor fin channel regions includes sidewalls and extends vertically with respect to the bottom source/drain layer. A gate dielectric layer adjoins each of the semiconductor fin channel regions and an electrically conductive gate electrode layer extends over the gate dielectric layer. A bottom dielectric spacer is positioned between the bottom source/drain layer and the gate electrode layer and a dielectric material layer extends over the bottom dielectric spacer. An epitaxial top source/drain region adjoins a top surface of each of the semiconductor fin channel regions. The monolithic structure further includes a plurality of opposing pairs of oxide regions, each of the oxide regions adjoining the dielectric material layer. The top source/drain regions are positioned, respectively, between the opposing pairs of oxide regions.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. Where an actor facilitates an action by other than performing the action, the action is nevertheless performed by some entity or combination of entities.

One or more embodiments or elements thereof can be implemented in the form of a computer program product including a computer readable storage medium with computer usable program code for performing the method steps indicated. Furthermore, one or more embodiments or elements thereof can be implemented in the form of a system (or apparatus) including a memory, and at least one processor that is coupled to the memory and operative to perform exemplary method steps. Yet further, in another aspect, one or more embodiments or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques as disclosed herein can provide substantial beneficial technical effects. By way of example only and without limitation, one or more embodiments may provide one or more of the following advantages:

Operational benefits of VFETs;
VFET arrays with uniform gate lengths;
Improved device performance consistency;
Abrupt top source/drain extension junction profiles.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIG. 2 is a view of the structure shown in FIG. 1A following fin patterning;

FIG. 3 is a schematic, cross-sectional view showing the structure of FIG. 2 following deposition of a bottom spacer and a germanium oxide fill layer;

FIG. 6A is a schematic, cross-sectional view showing the structure of FIG. 5 following gate metal and gate dielectric etch-back;

FIG. 6B is a schematic, cross-sectional view showing the structure of FIG. 5 following gate metal etch-back to form shared gate regions;

FIG. 9A is a schematic, cross-sectional view showing the structure of FIG. 8 following top source/drain epitaxy;

FIG. 9B is a schematic, cross-sectional view showing the structure of FIG. 8 following top source/drain epitaxy of a structure including a shared gate region;

FIG. 12 is a schematic, cross-sectional view showing the structure of FIG. 11 following annealing to oxidize a silicon germanium layer within the structure;

FIG. 13A is a schematic, cross-sectional view showing the structure of FIG. 12 following removal of the germanium oxide layer, deposition of gate dielectric and gate metal materials, and etch-back of the gate metal and gate dielectric materials;

FIG. 15 is a schematic, cross-sectional view showing the structure of FIG. 14 following fin hard mask removal and removal of oxide material beneath the hard mask;

FIG. 16 is a schematic, cross-sectional view showing the structure of FIG. 15 following metal gate recess;

FIG. 19A is a schematic, cross-sectional view showing the structure of FIG. 18 following top source/drain epitaxy, and FIG. 19B is a schematic, cross-sectional view showing a structure including VFETs having a shared gate region.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present disclosure will be described herein in the context of illustrative embodiments. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Figure 1B:
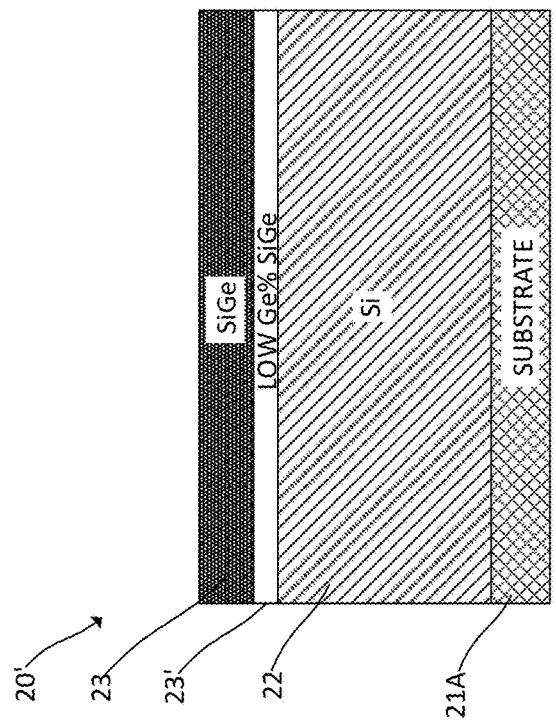
FIG. 1B is a schematic, cross-sectional illustration of a second embodiment of a multilayer structure comprised of semiconductor layers.
Figure 1A:
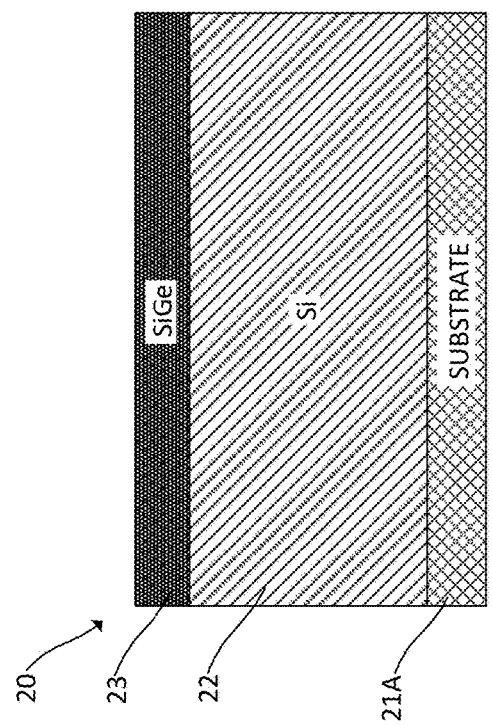
FIG. 1A is a schematic, cross-sectional illustration of a first embodiment of a multilayer structure comprised of semiconductor layers.

A monolithic structure 20 including a highly doped semiconductor substrate 21A is shown in FIG. 1A. The substrate 21A may consist essentially of silicon or silicon germanium including dopants of a selected conductivity type. In some embodiments, a semiconductor-on-insulator (SOI) wafer having a highly doped top layer is employed to fabricate the VFETs. The exemplary structure 20 further includes an essentially undoped semiconductor layer 22 on the doped substrate. The semiconductor layer 22, which may be monocrystalline silicon, has a thickness corresponding to the desired heights of an array of parallel fins to be formed on the substrate 21A. A silicon germanium layer 23 is in direct contact with the top surface of the essentially undoped (silicon) layer 22. In an exemplary embodiment, the silicon germanium layer 23 has the composition $Si_{1-x}Ge_x$ where x is between 0.3 and 0.7. In some exemplary embodiments, the semiconductor layer 22 and the silicon germanium layer 23 are epitaxially deposited on the substrate 21A to form the structure 20. The substrate (source/drain) layer 21A has a thickness between ten and sixty nanometers in some exemplary embodiments. The semiconductor layer 22 has a thickness between thirty and one hundred nanometers and the silicon germanium layer 23 has a thickness between five and fifteen nanometers in one or more exemplary embodiments.

In an alternative embodiment shown in FIG. 1B, the structure 20' includes two epitaxial silicon germanium layers 23, 23' above the semiconductor layer 22. The silicon germanium layer 23' adjoining the top surface of the semiconductor layer 22 has a relatively low germanium concentration and is usable as an etch stop layer. The second (top) silicon germanium layer 23 has a relatively high germanium concentration. In an exemplary embodiment, the bottom (low Ge percentage) silicon germanium layer 23' has the composition $Si_{1-x}Ge_x$ where x is between 0.2 and 0.3.

Referring again to FIG. 1A, the heavily bottom doped substrate (or source/drain layer) 21A is configured to function as a source/drain layer for subsequently formed VFETs. The source/drain layer is heavily doped with dopant(s) having a first conductivity type. An n+ substrate or substrate layer is employed in some embodiments. The term "n-type" refers to the addition of impurities that contribute free electrons to an intrinsic semiconductor. In a silicon containing substrate, examples of n-type dopants, i.e. impurities, include but are not limited to antimony, arsenic and phosphorous. The term "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. The height (thickness) of the substrate 21A may be, but is not necessarily limited to from about 10 nm to about 60 nm, with about 25 nm to about 45 nm preferred. The substrate 21A can be doped in situ if grown epitaxially. Alternatively, ion implantation followed by annealing can be employed to obtain the desired conductivity type and dopant concentration. Dopants may include, for example, an n-type dopant selected from a group of phosphorus (P), arsenic (As) and antimony (Sb), or a p-type dopant selected from a group of boron (B), gallium (Ga), indium (In), and thallium (Tl) at various concentrations. Selection of dopants depends on whether nFETs or pFETs are to be fabricated. For example, in a non-limiting example, a dopant concentration range may be e20/cm$^3$ to e21/cm$^3$, with 4e20/cm$^3$ to 8e20/cm$^3$ preferred. The substrate-source/drain layer 21A can include, but is not necessarily limited to, silicon (Si), silicon germanium (SiGe), or other semiconductor material. As indicated above, the semiconductor layer 22 is epitaxially grown on the substrate 21A and the silicon germanium layer 23 is epitaxially grown on the semiconductor layer 22 in some embodiments.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The epitaxial deposition process may employ the deposition chamber of a chemical vapor deposition type apparatus, such as a low pressure chemical vapor deposition (LPCVD) apparatus. A number of different precursors may be used for the epitaxial deposition of semiconductor material. In some embodiments, the gas source for the deposition of an epitaxially formed semiconductor material may include silicon (Si) deposited from silane, disilane, trisilane, tetrasilane, hexachlorodisilane, tetrachlorosilane, dichlorosilane, trichlorosilane, disilane and combinations thereof. In other examples, when the doped semiconductor material includes germanium, a germanium gas source may be selected from the group consisting of germane, digermane, halogermane, dichlorogermane, trichlorogermane, tetrachlorogermane and combinations thereof. The temperature for epitaxial silicon germanium deposition typically ranges from 450° C. to 900° C. Although higher temperature typically results in faster deposition, the faster deposition may result in crystal defects and film cracking. Examples of other epitaxial growth processes that can be employed in growing semiconductor layers described herein include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE).

A hard mask (not shown) is deposited on the structure 20 or 20' using conventional deposition techniques such as spin-on coating, CVD, plasma-assisted CVD, or other known techniques. Fin structures including semiconductor fin base portions 22A are formed beneath portions of the hard mask that remain on the structure following mask patterning, as shown in FIG. 2. The semiconductor fin base portions 22A extend vertically with respect to the substrate 21A following removal of the unprotected portions of the silicon and silicon germanium layers using an etching process such as a reactive ion etch (ME). The fin structures at this stage of the process include base portions 22A formed from the semiconductor layer 22 and silicon germanium regions 23A formed from the silicon germanium layer 23. The fin structures further include dielectric caps 24 formed from the remaining portions of the hard mask (HM) following hard mask patterning. Silicon nitride caps 24 are formed in some embodiments from a silicon nitride hard mask. While the fin structures are shown as having vertical side walls and horizontal top surfaces in the schematic illustrations, it will be appreciated that the fin structures may have somewhat different configurations such as triangular configurations wherein the fin bases are wider than the tops of the fins. The structure 25 shown in FIG. 2 may accordingly include fin structures having side walls that are not completely vertical. Fin heights are preferably equal. Fin heights, widths and spacing are further chosen in accordance with manufacturer preferences. The side walls of the base portions of the fin base portions 22A include (110) surfaces in one or more embodiments. As discussed above, the side walls of the fin structures, including the semiconductor base portions 22A may not be exactly vertical. Surfaces described as (110) surfaces herein are at least close to being (110) surfaces but may or may not be exactly (110) surfaces.

A bottom spacer 26 and a germanium oxide ($GeO_2$) fill 28 are deposited to obtain a structure as shown in FIG. 3. The oxide fill 28 may alternatively include silicon germanium oxide having a high germanium content (for example $Si_{1-}$ $_x$Ge$_x$ where x is greater than 0.5). The bottom spacer 26 may comprise an electrically insulating material, for example, silicon dioxide, silicon nitride, SiOCN, or SiBCN. Other non-limiting examples of materials for the bottom spacer include dielectric oxides (e.g., silicon oxide), dielectric nitrides (e.g., silicon nitride), dielectric oxynitrides, or any combination thereof. The bottom spacer 26 may have a thickness of about five to about ten nanometers, though such a range is not considered critical. The bottom spacer can be deposited directly on the top surface of the doped substrate (source/drain layer) 21A using directional deposition techniques including, but not necessarily limited to high density plasma (HDP) deposition and gas cluster ion beam (GCIB) deposition, or deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering. Both the substrate 21A and dielectric bottom spacer 26 are horizontal structures including horizontal, planar top surfaces in the exemplary embodiment. The germanium (or silicon germanium) oxide fill 28 can be deposited using any suitable process, for example ALD or CVD and directly contacts the fin structures (22A, 23A, 24).

Figures 4, 5:
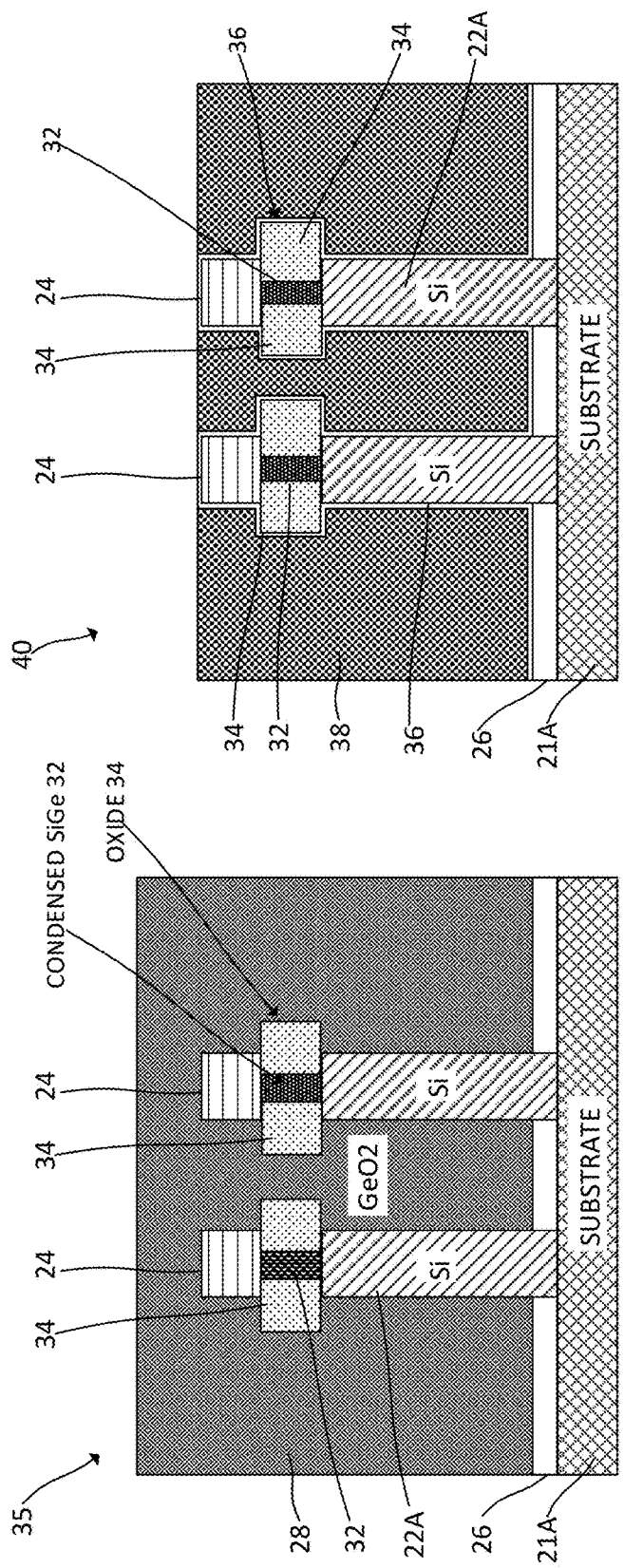
FIG. 4 is a schematic, cross-sectional view showing the structure of FIG. 3 following annealing to oxidize a silicon germanium layer within the structure.
FIG. 5 is a schematic, cross-sectional view showing the structure of FIG. 4 following removal of the germanium oxide layer and deposition of gate dielectric and gate metal materials.

The structure is subjected to thermal annealing to form condensed silicon germanium regions 32 between the semiconductor fin base portions 22A and the dielectric caps 24 and oxide structures 34 extending laterally from the condensed regions 32. FIG. 4 shows the structure following the thermal anneal. The oxide structures 34 include inner oxide regions adjoining the condensed silicon germanium regions and located between the caps 24 and the top surfaces of the semiconductor base portions 22A of the fin structures. Outer regions of the oxide structures extend laterally outside the area between the dielectric caps 24 and semiconductor base portions. A selective oxide formation process is conducted in nitrogen to form the structure 35 shown in FIG. 4. The temperature is maintained between 500-700° C. for 1 sec to 30 sec. Oxidation and condensation happen at the same time. Upon annealing the structure, the silicon in the silicon germanium portion 23A of each fin structure oxidizes at the surface portions thereof, forming the oxide structures 34. Silicon is preferentially oxidized compared to the germanium in the silicon germanium portion 23A. While the silicon oxidizes it is consumed to form silicon dioxide, increasing the germanium content in the remaining portions of the silicon germanium fin portions 23A. The germanium tends to diffuse into a region of lower germanium concentration. Accordingly, the germanium diffuses toward the centers of the silicon germanium portions of the fin structures. The silicon diffuses in the direction of the outer surfaces of the silicon germanium regions, where it is consumed. The process accordingly increases the germanium content of the condensed silicon germanium regions 32 with respect to the original germanium content of the silicon germanium layer 23. In other words, the condensation process causes the diffusion of germanium from the silicon germanium portions 23A between the semiconductor fin base portions 22A and the dielectric caps 24 to form silicon germanium regions 32 that are thinner than the semiconductor base portions 22A and which have a higher germanium content than the original silicon germanium layer 23. In some embodiments, the germanium content of the germanium-condensed SiGe regions 32 is between forty and eighty percent ($Si_{1-x}Ge_x$ where x is between 0.4 and 0.8).

The selective oxide formation process employed herein allows the semiconductor base portions 22A of the fin structures to remain essentially unoxidized while only the silicon germanium portions of the fin structures undergo condensation/oxidation. Unlike the silicon germanium fin structure portions 23A formed from the silicon germanium layer 23, semiconductor fin base portions 22A contacting the germanium oxide fill are not materially oxidized during the annealing process and will be functional as channel regions of the subsequently formed VFETs. Silicon germanium having a sufficiently low molecular percentage of germanium will, like monocrystalline silicon, be essentially unreactive with germanium oxide during such annealing. Accordingly, the layer 23' of silicon germanium having a low germanium percentage (see FIG. 1B) or low-Ge silicon germanium fin base portions 22A, if employed, will remain essentially intact and unoxidized while the fin portions formed from the adjoining silicon germanium layer 23B condensed/oxidized. The absence of oxygen in the environment in which thermal annealing is conducted and the protection afforded by the germanium oxide fill 28 during annealing helps ensure that oxide regions are formed only where desired. Due to volume expansion caused by oxidation, the oxide regions 34 are wider than the underlying, essentially unoxidized semiconductor fin base portions 22A formed from the semiconductor layer 22 as well as the dielectric caps 24.

A gate dielectric layer and a work function metal (WFM) layer are deposited sequentially to form a gate stack for the VFET device, as schematically illustrated in FIG. 5. The gate dielectric layer and WFM layer are designated by numeral 36 in the drawings. The gate dielectric layer adjoins the top surface of the bottom spacer 26, the sidewalls of the semiconductor fin base portions 22A, the oxide structures 34, and the dielectric caps 24. Non-limiting examples of suitable materials for the gate dielectric layer include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The gate dielectric layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric material may vary depending on the deposition process as well as the composition and number of high-k dielectric materials used. In some embodiments, the gate dielectric layer includes multiple layers.

The work function metal layer is disposed over the gate dielectric layer followed by the deposition of metal gate material in obtaining a structure 40 as shown in FIG. 5. Non-limiting examples of suitable work function metals include p-type work function metal materials and n-type work function metal materials. The dielectric layer 24 may comprise a plurality of dielectric layers. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, CVD, PECVD, PVD, plating, thermal or e-beam evaporation, and sputtering. The gate stack layers in some embodiments each include a work function metal layer such as TiN, TaN, TiC, TiAlC, TiSiN, TaSiN, TaC or HfN and a dielectric layer such as $HfO_2$, $HfSiO_x$, SiON or other preferably high-k composition. Metal gates 38 are formed around the fins 22A and over the bottom spacer 26. Metal gate material can be deposited by any suitable process, for example atomic layer deposition (ALD) or physical vapor deposition (PVD). In one embodiment, the metal gate 38 is a continuous metal gate that wraps around all the fins 22A and gate dielectric/WFM layers 36. The metal gate 38 directly contacts the outer sidewalls of the high-k gate dielectric/work function layer 36. The top surface of the metal gate is co-planar with the top surfaces of the dielectric caps 24 following planarization. In some embodiments, the metal gate 38 includes tungsten or cobalt. A structure 40 including gate-all-around (GAA) configurations for the VFETs is thereby obtained.

The gate metal is etched to form shared or non-shared gate regions for the VFETs. In a first embodiment shown in FIG. 6A, the gate metal and gate dielectric/WFM layers are etched down to the top surface of the bottom spacer 26 to form recesses 41 for VFET devices having non-shared gate regions. A directional reactive ion etch may be employed to obtain the structure shown in FIG. 6A using the bottom spacer 26 as an etch stop. The outer surfaces of the metal gates 38 may be vertically aligned with the outer surfaces of the oxide structures 34 following etch-back of the gate metal. In a second embodiment, the gate metal is subjected to a timed etch such that recesses therein extend only partially through the gate metal. A mask (not shown) may be applied and patterned prior to etching portions of the structure. The gate metal between adjoining fins 22A is accordingly connected by the bottom portion below the recesses 42, as shown in FIG. 6B. The upper portions of the metal gates 38' may have lateral surfaces that are vertically aligned with the lateral surfaces of the outer oxide regions of the oxide structures 34 following formation of the recesses 42.

Figure 7:
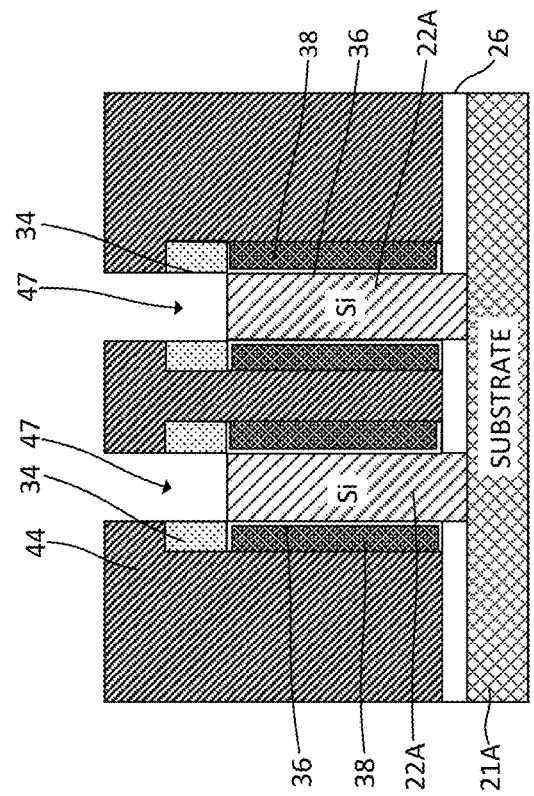
FIG. 7 is a schematic, cross-sectional view showing the structure of FIG. 6A following deposition of a dielectric layer.

The structure 45 shown in FIG. 7 is obtained by depositing a dielectric material such as $SiO_2$ on the structure shown in FIG. 6A. The dielectric material may be deposited using atomic layer deposition (ALD) or chemical vapor deposition (CVD) to form a dielectric layer 44 encapsulating the semiconductor base portions 22A of the fin structures, gate stacks 36, 38, and oxide structures 34. Alternatively, a flowable oxide can be deposited on the structure, filling the gaps between the semiconductor fin base (channel) portions 22A. Flowable oxide materials are commercially available and known to those of skill the art. The dielectric layer 44 is subjected to chemical mechanical planarization (CMP) down to the top surfaces of the dielectric caps 24.

Figure 8:
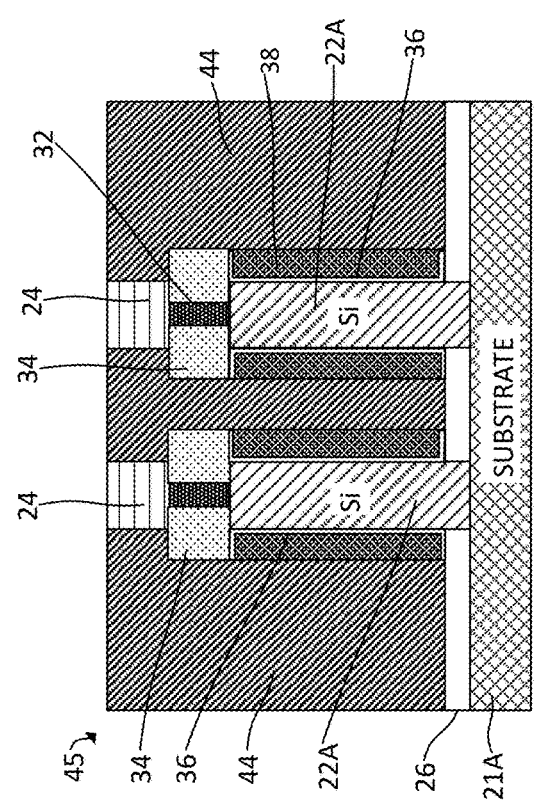
FIG. 8 is a schematic, cross-sectional view showing the structure of FIG. 7 following fin hard mask removal and removal of oxide material beneath the hard mask.

Referring to FIG. 8, the dielectric (nitride) caps 24 are stripped using hot phosphoric acid or other suitable stripping technique to form recesses 47. The oxide structures 34 are then subjected to a reactive ion etch (RIE) to expose the top surfaces of the semiconductor base portions 22A (or the silicon germanium layer 23' shown in FIG. 1B in embodiments wherein such a layer is employed as an etch stop). Following removal of the caps 24 and inner oxide regions from the oxide structures 34 and possible cleaning of the top surfaces of the semiconductor base portions 22A, top source/drain regions 21B are epitaxially grown within the recesses 47 on the top surfaces of the semiconductor base portions 22A. (At this stage of the process, the semiconductor base portions 22A form the entireties of the fin structures extending from the substrate/bottom source/drain layer 21.) A structure 50 as shown in FIG. 9A is obtained following such epitaxial growth. The remaining outer regions of the oxide structures 34 form self-aligned oxide spacers on both sides of each top source/drain region 21B. The top source/drain regions 21B may be doped in situ to have the same conductivity type and doping concentration as the substrate/bottom source/drain region 21A. The top and bottom source/drain regions (21B, 21A) have essentially the same composition (e.g. Si or SiGe) in an exemplary embodiment. In this embodiment, the gate regions of the adjoining VFETs are electrically isolated (unshared). A plurality of VFETs is accordingly provided within a monolithic structure 50, each VFET having the same gate length.

FIG. 9B shows a monolithic structure 50' including adjoining VFETs having a shared metal gate 38'. The structure 50' is obtained following processing of the structure shown in FIG. 6B substantially as discussed above with respect to FIGS. 7 and 8 and epitaxial growth of top source/drain regions 21B.

Figure 10:
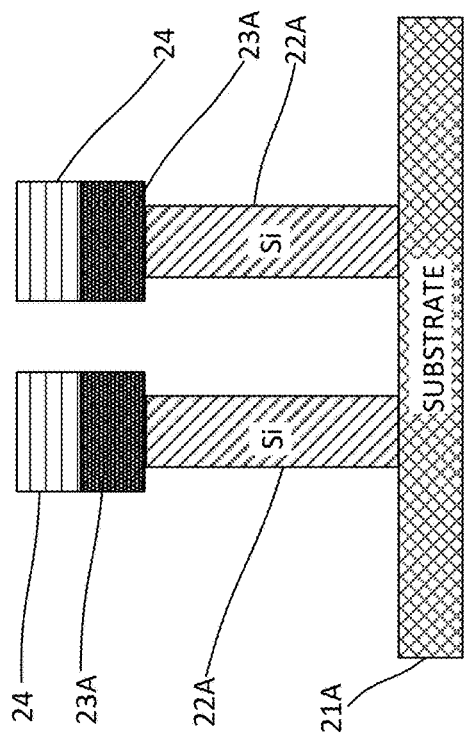
FIG. 10 is a schematic, cross-sectional view showing the structure of FIG. 2 following selective trimming of the semiconductor fins.

A second embodiment of fabricating VFETs having uniform gate lengths includes obtaining a structure 25 as shown in FIG. 2. Referring to FIG. 10, the silicon base portions 22A of the fin structures are selectively trimmed to reduce the widths thereof. A timed anisotropic wet etching process to selectively recess silicon base portions may employ TMAH (tetramethyl ammonium hydroxide) or potassium hydroxide (KOH). Lateral recessing of the silicon is discontinued once the silicon regions of the fin structure are thinner than the dielectric caps 24 but still have sufficient thickness to function as channel regions of subsequently formed VFETs. The widths of the silicon regions of the fins are reduced from about twenty nanometers (20 nm) to about seven nanometers (7 nm) in some exemplary embodiments.

Figure 11:
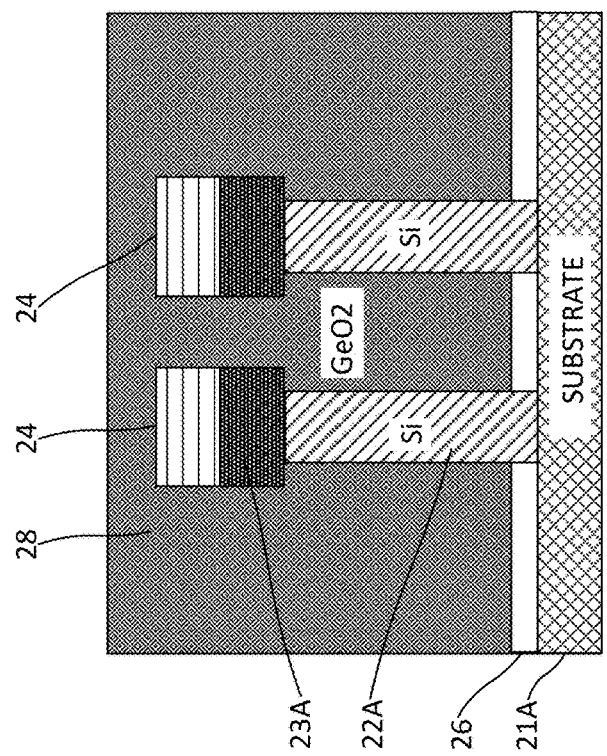
FIG. 11 is a schematic, cross-sectional view showing the structure of FIG. 10 following bottom spacer formation and deposition of a germanium oxide fill layer.

A structure 60 as schematically illustrate in FIG. 11 is obtained following deposition of a bottom spacer 26 and a germanium oxide (or silicon germanium oxide) fill 28. Deposition of such elements is discussed above with respect to FIG. 3 and can be employed in the second embodiment of the fabrication process. The structure is then subjected to thermal annealing to obtain a structure 65 as shown in FIG. 12, forming condensed silicon germanium regions 32 and laterally expanded oxide structures 34. The oxide structures 34 exceed the widths of both the dielectric caps 24 and the underlying semiconductor base portions 22A of the fins, neither of which is materially oxidized during thermal anneal. The discussion of thermal condensation/oxidation with respect to FIG. 4 is applicable to the process of obtaining the structure 65 shown in FIG. 12.

Figure 14:
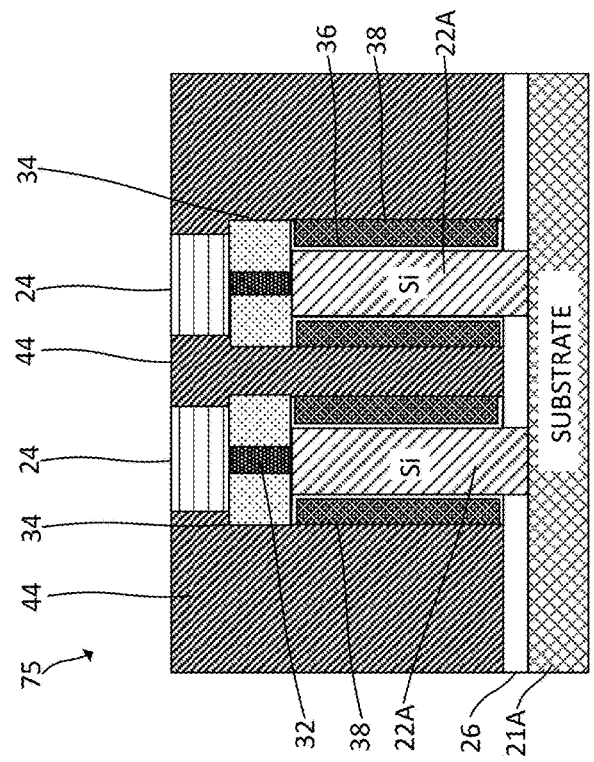
FIG. 14 is a schematic, cross-sectional view showing the structure of FIG. 13A following deposition of a dielectric layer and planarization of the dielectric layer.
Figure 13B:
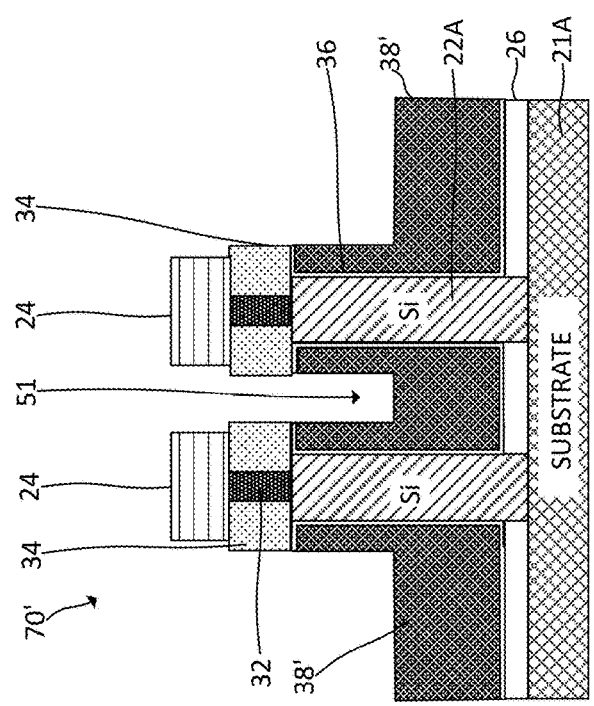
FIG. 13B is a schematic, cross-sectional view showing a structure following removal of the germanium oxide layer, deposition of gate dielectric and gate metal materials, and etch-back of the gate metal to form a structure having a shared gate region.

FIGS. 13A and 13B show two monolithic structures 70, 70' obtained following a sequence of fabrication steps. The structure 70 shown in FIG. 13A, which includes non-shared gate regions, is obtained following gate dielectric, WFM and gate metal deposition followed by etch-back of the deposited elements down to the bottom spacer 26. Similar deposition and etch-back steps are discussed above with respect to FIGS. 5 and 6A. The structure 70' is obtained following partial metal gate recess of the structure 65. Partial gate recessing of a similar structure is discussed above with respect to FIG. 6B. Because the semiconductor base (channel) portions 22A have been thinned prior to forming the structures 70, 70', the metal gate regions adjoining the channel regions can be thicker than those obtained during fabrication of the structures shown in FIGS. 6A and 6B, respectively. FIG. 14 schematically illustrates a monolithic structure 75 including non-shared gate regions following deposition of a dielectric layer 44 encapsulating the elements shown in FIG. 13A and chemical mechanical planarization of the dielectric layer down to the dielectric caps 24 above the condensed silicon germanium and oxide regions 32, 34. Such a dielectric layer would be also deposited and planarized on the structure 70' shown in FIG. 13B if structures including VFETs having shared gate regions were to be fabricated.

Referring to the structure 80 shown in FIG. 15, a dry reactive ion etch may be employed to remove the dielectric caps 24. A further reactive ion etch causes the removal of the inner regions of the oxide structures 34 and the condensed SiGe regions 32 formerly positioned directly beneath the caps 24. The etch is selective to the underlying silicon and gate metal. The outer regions the oxide regions structures 34 are protected by the dielectric layer 44 and remain on the structure. Due to the prior trimming of the semiconductor base (channel) portions 22A, top surface portions of both the metal gates 38 and base semiconductor portions are exposed at the bottoms of recesses 48 following removal of the dielectric caps 24, the inner regions of the oxide structures, and the condensed SiGe regions 32.

Partial recessing of the metal gate 38 provides divots 48A therein extending downwardly from the previously formed recesses 48, as shown in FIG. 16. The divots 48A expose upper sidewall portions of the semiconductor fin base portions 22A. Gate dielectric material may or may not remain on the fin sidewall portions adjoining the divots 48A. Portions of the metal gate 38 may remain in opposing relation to the upper sidewall portions of the semiconductor fin base portions 22A following formation of the divots 48A. A structure 85 as exemplified by that shown in FIG. 16 may accordingly be obtained.

Figure 18:
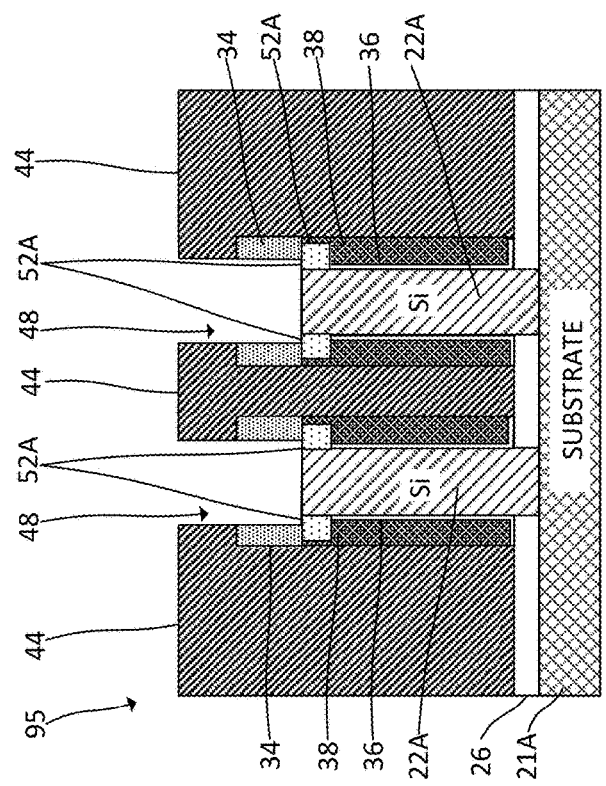
FIG. 18 is a schematic, cross-sectional view showing the structure of FIG. 17 following etch-back of the dielectric liner down to the top surface of the semiconductor fin.
Figure 17:
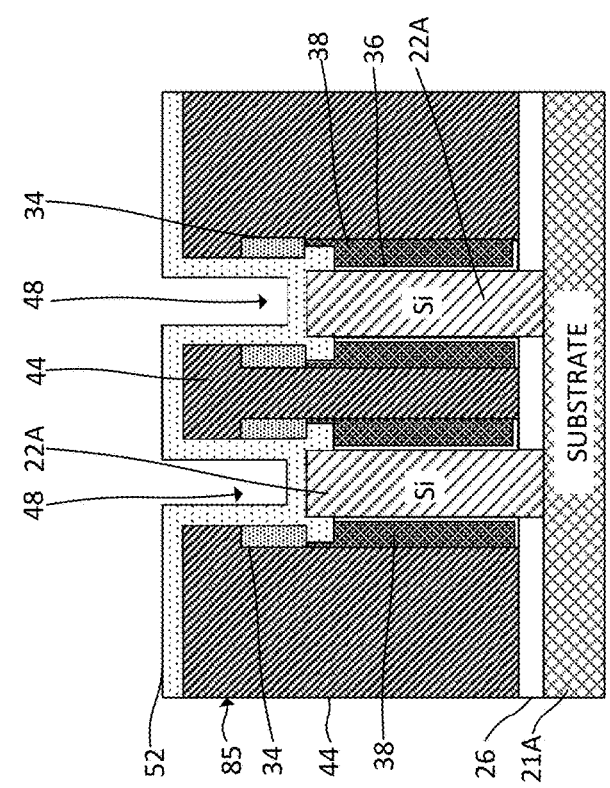
FIG. 17 is a schematic, cross-sectional view showing the structure of FIG. 16 following deposition of a dielectric liner.

A dielectric liner 52 is conformally deposited on the structure 85, as shown in FIG. 17. SiON (silicon oxynitride), SiBCN (silicon borocarbonitride), SiOCN (silicon oxycarbonitride), and SiOC (silicon oxycarbide) are among the dielectric materials that can be employed to form the dielectric liner 52. The liner 52 extends within the recesses 48 and divots 48A and over the dielectric layer 44, the inner surfaces of the oxide regions 34, the top surfaces of the metal gates 38 and adjoining gate dielectric/WFM layer 36, and the top surfaces of the semiconductor fin base portions 22A. The divots 48A are filled with liner material in some embodiments. Conformal deposition of the dielectric liner 52 results in the divots 48A containing a thicker dielectric liner than in other areas of the structure. The liner material is then etched back to form sets of inner (top) spacers 52A on the top surfaces of the metal gates 38. An isotropic wet etch is targeted to remove a certain thickness of the dielectric liner 52 without materially etching the dielectric material within the divots 48A. The inner spacers 52A formed within the divots 48A from the dielectric liner 52 provide electrical isolation of the metal gates 38 from subsequently formed top source/drain regions. FIG. 18 schematically illustrates an exemplary structure 90 that can be obtained following formation of the inner spacers 52A. Etch-back of the liner causes exposure of at least the top surfaces of the semiconductor fin base (channel) portions 22A and possibly sidewall portions near the tops of the channel portions.

Top source/drain regions 21B are epitaxially grown on the exposed surfaces of the top regions of the semiconductor fin base portions 22A and doped in situ. By "in-situ" it is meant that the dopant that dictates the conductivity type of the doped layer is introduced during the process step, e.g., epitaxial deposition, that forms the doped layer. A dopant drive-in anneal (900° C. to 1050° C.) may be conducted for junction formation. As discussed above with respect to FIG. 9A, the top source/drain regions 21B may have the same conductivity type and doping concentration as the substrate/bottom source/drain region 21A. The top and bottom source/drain regions (21B, 21A) have essentially the same composition (e.g. Si or SiGe) in an exemplary embodiment. In the structure 100 depicted in FIG. 19A, the gate regions of the adjoining VFETs are electrically isolated (unshared). The metal gate 38 is electrically isolated from the bottom source/drain region 21A by the bottom spacer 26 and from the top source/drain region 21B by the top spacers 52A. The top source/drain regions 21B are contained within the recesses 48. Excess epitaxial growth can be removed by chemical mechanical planarization. The semiconductor fin base portions 22A may extend above the top surfaces of the top spacers 52A in some embodiments (not shown), which allows epitaxial growth of the top source/drain regions 21B on the (110) fin sidewalls. The exposed portions of the fin sidewalls on which top source/drain regions are grown can be in the range of about two to twenty nanometers (2-20 nm). Self-limiting diamond-shaped epitaxial structures (not shown) can accordingly be formed, though space constraints may result in confined rather than self-limiting epitaxial growth even where fin sidewalls are exposed.

FIG. 19B shows a monolithic structure 100' including adjoining VFETs having a shared metal gate 38'. The structure 100' is obtained following processing of the structure shown in FIG. 13B substantially as discussed above with respect to FIGS. 14-18 and epitaxial growth of top source/drain regions 21B that are operatively associated with the channel regions. The VFETs of all embodiments disclosed herein can be nFETs or pFETs depending on the conductivity types of the source/drain regions 21A, 21B.

Top source/drain contacts (not shown) are formed using suitable metallization processes. Gate and bottom source/drain contacts (not shown) are also formed within the structure. Such contacts may be formed using processes known to the art or which may be developed in the future.

The electronic devices comprising the structures 50, 50', 100, 100' may be incorporated within electronic circuitry that, in one or more exemplary embodiments, comprises an integrated circuit (IC). In other words, the electronic circuitry may include an assembly of electronic components, fabricated as a monolithic unit, in which active and passive devices and their interconnections are formed. The resulting circuit may perform one or more functions (e.g. logic, memory, sensing) depending on the arrangement of the components.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material when forming a semiconductor structure. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., *Silicon VLSI Technology: Fundamentals, Practice, and Modeling* 1$^{st}$ *Edition*, Prentice Hall, 2001 and P. H. Holloway et al., *Handbook of Compound Semiconductors: Growth, Processing, Characterization, and Devices*, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Given the discussion thus far, it will be appreciated that, in general terms, an exemplary method of fabricating a monolithic structure including vertical transport field-effect transistors having fixed gate lengths includes obtaining a first structure including a doped bottom source/drain layer and a plurality of fin structures. As shown in the exemplary structure depicted in FIG. 2, each of the fin structures includes a semiconductor fin base portion 22A comprising silicon and adjoining and extending vertically from the bottom source/drain layer 21A. Each fin structures further includes a dielectric cap 24 and a silicon germanium portion 23A between the semiconductor fin base portion and the dielectric cap. A bottom dielectric spacer 26 is deposited over the bottom source/drain layer. An oxide layer 28 such as germanium oxide is deposited over the first structure such that it directly contacts the semiconductor fin base portions 22A and the silicon germanium portions 23A of the fin structures. Thermally annealing causes formation of condensed silicon germanium regions 32 and expanded oxide structures 34 from the silicon germanium portions of the fin structures. The oxide structures 34 extend laterally from the condensed silicon germanium regions 32 and include inner oxide regions adjoining the condensed silicon germanium regions and outer oxide regions extending laterally from the inner oxide regions. The volume occupied by the oxide structures exceeds the volume of the oxidized silicon germanium material from which they are formed. The condensed silicon germanium regions 32 having higher germanium concentrations than the silicon germanium portions 23A. The semiconductor fin base portions 22A of the fin structures remain essentially unoxidized during the thermal annealing of the first structure, allowing their subsequent use as channel regions of the VFETs. Following thermally annealing the oxide layer 28 is removed. Gate dielectric and gate electrode layers are deposited over at least the semiconductor fin base portions 22A. A dielectric material layer 44 is deposited over the bottom dielectric spacer 26 and the gate electrode layer 38 as shown in FIGS. 7 and 14. The dielectric caps 24, the condensed silicon germanium regions 32 and the inner oxide regions are removed, thereby exposing at least the top surfaces of the semiconductor fin base portions 22A. Top source/drain regions 21B are epitaxially grown on the exposed surfaces of the semiconductor fin base portions 22A. The exemplary structures 50, 50', 100, 100' shown in FIGS. 9A, 9B, 19A and 19B, respectively, can accordingly be obtained. Obtaining the first structure may include epitaxially growing a semiconductor layer 22 on the doped bottom source/drain layer 21A, epitaxially growing a silicon germanium layer 23 on the silicon layer, depositing a hard mask on the silicon germanium layer, patterning the hard mask, and forming the fin structures from the semiconductor layer 22, the silicon germanium layer 23 and the hard mask. The dielectric caps 24 are formed from the hard mask in some embodiments. Thermally annealing to oxidize the silicon germanium portions 23A of the fin structures is preferably conducted in a substantially oxygen-free environment such as nitrogen to help minimize or avoid oxidation of the channel regions. Thermally annealing causes the outer oxide regions to extend laterally beyond the sidewalls of the semiconductor fin base portions 22A, allowing the top source/drain regions 21B to be grown between pairs of opposing outer oxide regions 34.

Further given the above discussion, a monolithic structure including a plurality of vertical field-effect transistor structures is provided. The monolithic structure includes a bottom source/drain layer 21A, a plurality of parallel semiconductor fin channel regions 22A operatively associated with the bottom source/drain layer, a gate dielectric layer adjoining each of the semiconductor fin channel regions, and an electrically conductive gate electrode layer over the gate dielectric layer. A bottom dielectric spacer 26 between the bottom source/drain layer 21A and the gate electrode layer 38 electrically isolates the two elements. A dielectric material layer 44 is positioned over the bottom dielectric spacer 26. An epitaxial top source/drain region 21B adjoins a top surface of each of the semiconductor fin channel regions 22A. The top source/drain regions 21B are positioned, respectively, between the opposing pairs of oxide regions 34. FIGS. 9A, 9B, 19A and 19B schematically illustrate exemplary monolithic structures including VFETs as described herein. In some embodiments, the semiconductor fin channel regions 22A consist essentially of monocrystalline silicon. As discussed above, the material chosen for the fin channel regions allows the selective oxidation silicon germanium used to form the oxide regions. In the exemplary structures 100, 100', divots 48A extend within the gate electrode layer 38 and adjoin the sidewalls of the semiconductor fin channel regions 22A. A dielectric liner 52A is within the divots is configured for electrically isolating the top source/drain regions 21B from the gate electrode layer 38. The monolithic structure may further include recesses within the gate electrode layer and extending downwardly between the semiconductor fin channel regions. The dielectric material layer 44 fills the recesses. Exemplary recesses 41, 42 within gate electrode layers are shown in FIGS. 6A and 6B, respectively.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits. Any of the exemplary circuits illustrated in the accompanying figures, or portions thereof, may be part of an integrated circuit. Integrated circuits so manufactured are considered part of this disclosure.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having VFETs therein.

An integrated circuit in accordance with aspects of the present disclosure can be employed in essentially any application and/or electronic system where the use of VFETs would be beneficial. Given the teachings of the present disclosure provided herein, one of ordinary skill in the art will be able to contemplate other implementations and applications of embodiments disclosed herein.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" another layer, it will be understood that there may or may not be intermediate elements or layers between the two specified layers. If a layer is described as "directly on" another layer, direct contact of the two layers is indicated. As the term is used herein and in the appended claims, "about" means within plus or minus ten percent.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.76(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A method of fabricating a monolithic structure including a plurality of vertical field-effect transistors, comprising:
   obtaining a first structure including:
      a bottom source/drain layer, and
      a plurality of fin structures, each of the fin structures including:
         a semiconductor fin base portion comprising silicon, each semiconductor base portion adjoining and extending vertically from the doped source/drain layer, each semiconductor fin base portion further including a top surface and vertically extending sidewalls;
         a dielectric cap, and
         a silicon germanium portion between the semiconductor fin base portion and the dielectric cap, the fin structures being parallel to each other;
   depositing a bottom dielectric spacer on the bottom source/drain layer;
   depositing an oxide layer over the first structure and directly contacting the semiconductor fin base portions and the silicon germanium portions of the fin structures, the oxide layer comprising germanium;
   thermally annealing the first structure subsequent to depositing the oxide layer, thereby causing formation of condensed silicon germanium regions and oxide structures from the silicon germanium portions of the fin structures, the oxide structures extending laterally from the condensed silicon germanium regions and including inner oxide regions adjoining the condensed silicon germanium regions and outer oxide regions extending laterally from the inner oxide regions, the condensed silicon germanium regions having higher germanium concentrations than the silicon germanium portions, the semiconductor fin base portions of the fin structures remaining essentially unoxidized during the thermal annealing of the first structure;
   removing the oxide layer following thermally annealing the first structure;
   depositing a gate dielectric layer on the semiconductor fin base portions of the fin structures;
   depositing a gate electrode layer over the gate dielectric layer and the bottom dielectric spacer;
   depositing a dielectric material layer over the bottom dielectric spacer and the gate electrode layer;
   removing the dielectric caps, the condensed silicon germanium regions and the inner oxide regions, thereby exposing at least the top surfaces of the semiconductor fin base portions, and
   epitaxially forming top source/drain regions on the semiconductor fin base portions.

2. The method of claim 1, wherein the oxide layer consists essentially of germanium oxide or silicon germanium oxide.

3. The method of claim 2, wherein obtaining the first structure includes:
   epitaxially growing a semiconductor layer on the doped bottom source/drain layer;
   epitaxially growing a silicon germanium layer on the silicon layer;
   depositing a hard mask on the silicon germanium layer;
   patterning the hard mask, and
   forming the fin structures from the semiconductor layer, the silicon germanium layer and the hard mask, the semiconductor fin base portions of the fin structures being formed from the semiconductor layer, the silicon germanium portions of the fin structures being formed from the silicon germanium layer, and the dielectric caps being formed from the hard mask.

4. The method of claim 2, wherein thermally annealing the first structure is conducted in a substantially oxygen-free environment.

5. The method of claim 2, wherein thermally annealing the first structure causes the outer oxide regions to extend laterally beyond the sidewalls of the semiconductor fin base portions, and further wherein the top source/drain regions are epitaxially formed between pairs of opposing outer oxide regions.

6. The method of claim 5, further including:
   forming recesses within the gate electrode layer and extending downwardly between the semiconductor fin base portions, and
   wherein depositing the dielectric material layer further includes filling the recesses with dielectric material.

7. The method of claim 1, wherein the semiconductor fin base portions consist essentially of monocrystalline silicon and the silicon germanium portions of the fin structures consist essentially of silicon germanium having the composition $Si_{1-x}Ge_x$ wherein x is between 0.3 and 0.7.

8. The method of claim 1, wherein:
   the silicon germanium portions of the fin structures consist essentially of silicon germanium having the composition $Si_{1-x}Ge_x$ wherein x is between 0.3 and 0.7, and
   each of the fin structures further includes a silicon germanium layer between the semiconductor fin base portion and the silicon germanium portion, the silicon germanium layer having the composition $Si_{1-x}Ge_x$ wherein x is less than 0.3, the silicon germanium layer forming the top surface of each semiconductor fin base portion.

9. The method of claim 1, further including trimming the semiconductor fin base portions selective to the silicon germanium portions and the dielectric caps, thereby reducing the widths of the semiconductor fin base portions prior to depositing the oxide layer.

10. The method of claim 9, further including:
    forming divots within the gate electrode layer subsequent to removing the dielectric caps, the condensed silicon germanium regions and the inner oxide regions, the divots adjoining the sidewalls of the semiconductor fin base portions, and
    forming a dielectric liner within the divots and above the gate electrode layer, the dielectric liner being configured for electrically isolating the top source/drain regions from the gate electrode layer.

11. The method of claim 10, wherein thermally annealing the first structure causes the outer oxide regions to extend laterally beyond the sidewalls of the semiconductor fin base portions, and further wherein the top source/drain regions are epitaxially formed between pairs of opposing outer oxide regions and above the dielectric liner.

12. The method of claim 11, wherein the semiconductor fin base portions consist essentially of monocrystalline silicon and the silicon germanium portions of the fin structures consist essentially of silicon germanium having the composition $Si_{1-x}Ge_x$ wherein x is 0.3 or greater.

13. The method of claim 11, wherein the oxide layer consists essentially of germanium oxide or silicon germanium oxide.

14. The method of claim 11, further including:
    forming recesses within the gate electrode layer and extending downwardly between the semiconductor fin base portions, and wherein depositing the dielectric material layer further includes filling the recesses with dielectric material.

15. A monolithic structure including a plurality of vertical field-effect transistor structures, comprising:
- a bottom source/drain layer;
- a plurality of parallel semiconductor fin channel regions operatively associated with the bottom source/drain layer, each of the semiconductor fin channel regions including sidewalls and extending vertically with respect to the bottom source/drain layer;
- a gate dielectric layer adjoining each of the semiconductor fin channel regions;
- an electrically conductive gate electrode layer over the gate dielectric layer;
- a bottom dielectric spacer between the bottom source/drain layer and the gate electrode layer;
- a dielectric material layer over the bottom dielectric spacer;
- an epitaxial top source/drain region adjoining a top surface of each of the semiconductor fin channel regions; and
- a plurality of opposing pairs of oxide regions, each of the oxide regions adjoining the dielectric material layer, the top source/drain regions being positioned, respectively, between the opposing pairs of oxide regions.

16. The monolithic structure of claim 15, wherein the semiconductor fin channel regions consist essentially of monocrystalline silicon.

17. The monolithic structure of claim 15, further including divots extending within the gate electrode layer and adjoining the sidewalls of the semiconductor fin channel regions and a dielectric liner within the divots and above the gate electrode layer, the dielectric liner being configured for electrically isolating the top source/drain regions from the gate electrode layer.

18. The monolithic structure of claim 15, further including recesses within the gate electrode layer and extending downwardly between the semiconductor fin channel regions, the dielectric material layer filling the recesses.

19. The monolithic structure of claim 18, wherein the dielectric material layer adjoins the bottom dielectric spacer and electrically isolates portions of the gate electrode layer from each other.

20. The monolithic structure of claim 18, wherein the oxide regions include outer surfaces defining spaces vertically aligned with the recesses within the gate electrode layer, the dielectric material layer filling the spaces.

* * * * *